United States Patent
Xiaobing et al.

(10) Patent No.: US 8,182,713 B2
(45) Date of Patent: May 22, 2012

(54) LEAD-FREE PIEZOELECTRIC MATERIAL

(75) Inventors: Ren Xiaobing, Tsukuba (JP); Liu Wenfeng, Tsukuba (JP)

(73) Assignee: National Institute for Materials Science, Tsukuba-shi (JP)

( * ) Notice: Subject to any disclaimer, the term of this patent is extended or adjusted under 35 U.S.C. 154(b) by 0 days.

(21) Appl. No.: 12/921,465

(22) PCT Filed: Mar. 10, 2009

(86) PCT No.: PCT/JP2009/054540
§ 371 (c)(1),
(2), (4) Date: Sep. 8, 2010

(87) PCT Pub. No.: WO2009/113535
PCT Pub. Date: Sep. 17, 2009

(65) Prior Publication Data
US 2011/0037015 A1    Feb. 17, 2011

(30) Foreign Application Priority Data
Mar. 11, 2008   (JP) .................................. 2008-061044

(51) Int. Cl.
C04B 35/00    (2006.01)
(52) U.S. Cl. ................................. 252/62.9 PZ; 501/139
(58) Field of Classification Search ............. 252/62.9 R, 252/62.9 PZ; 501/135, 136, 137, 138, 139
See application file for complete search history.

(56) References Cited

U.S. PATENT DOCUMENTS

| | | | | |
|---|---|---|---|---|
| 5,296,425 A | * | 3/1994 | Chazono et al. | ............. 501/138 |
| 6,960,547 B2 | | 11/2005 | Matoba et al. | |
| 7,033,521 B2 | * | 4/2006 | Iwashita et al. | .......... 252/62.9 R |
| 7,678,724 B2 | * | 3/2010 | Yanagida et al. | ............. 501/139 |
| 7,718,560 B2 | | 5/2010 | Yanagida et al. | |
| 2003/0057405 A1 | | 3/2003 | Matoba et al. | |
| 2004/0084994 A1 | | 5/2004 | Iwashita et al. | |
| 2006/0045840 A1 | * | 3/2006 | Chen et al. | .................... 423/598 |
| 2006/0152304 A1 | * | 7/2006 | Liang et al. | .................... 333/176 |
| 2007/0287625 A1 | | 12/2007 | Yanagida et al. | |

FOREIGN PATENT DOCUMENTS

| | | | |
|---|---|---|---|
| JP | 2002-274937 A | | 9/2002 |
| JP | 2002274937 A | * | 9/2002 |
| JP | 2003-109430 A | | 4/2003 |
| JP | 2004-006722 A | | 1/2004 |
| JP | 2006-206429 A | | 8/2006 |
| JP | 2007-331956 A | | 12/2007 |
| JP | 2008-151638 A | | 7/2008 |

OTHER PUBLICATIONS

Yu, Zhi et al. "Dielectric Behavior of Ba(Ti1-xZrx)O3 single crystals," Journal of Applied Physics, Jul. 1, 2000, pp. 410, vol. 88, No. 1.
Mitsui, T. et al. "Dielectric and X-Ray Studies of CaxBa1-xTiO3 and CaxSr1-xTiO3," Physical Review, Dec. 1, 1961, pp. 1354-1369, vol. 124, No. 5.
International Search Report of PCT/JP2009/054540, mailing date Jun. 9, 2009.

* cited by examiner

Primary Examiner — Jerry Lorengo
Assistant Examiner — Lynne Edmondson
(74) Attorney, Agent, or Firm — Westerman, Hattori, Daniels & Adrian, LLP

(57) ABSTRACT

There is provided a lead-free piezoelectric material capable of showing a high piezoelectric coefficient ($d_{33}$>500 pC/N) exceeding that of soft PZT. The lead-free piezoelectric material contains no toxic element such as Pb, comprising a pseudo-binary solid solution of $\{[(Ba_{1-x1}M1_{x1})((Ti_{1-x}Zr_x)_{1-y1}N1_{y1})O_3]\text{-}\delta\%[(Ba_{1-y}Ca_y)_{1-x2}M2_{x2})(Ti_{1-y2}N2_{y2})O_3]\}$ (wherein M1, N1, M2 and N2 represent an additive element) (abbreviated as BZT-δ% BCT).

3 Claims, 5 Drawing Sheets

LEAD-FREE PIEZOELECTRIC MATERIAL

TECHNICAL FIELD

The present invention relates to a lead-free piezoelectric material containing no toxic element such as Pb.

BACKGROUND ART

Piezoelectric materials have an effect of expanding and contracting when a voltage is applied (electrostrain effect) and reversely generating a voltage when pressure is applied (piezoelectric effect). Therefore they are a very important group of substances which can convert mechanical energy to electric energy. These materials have been widely applied to products in the field of energy conversion, such as actuators and sensors, and are widespread from daily life to cutting-edge technologies, playing an essential role in today's society.

Over the last five decades, PZT (Pb(Ti,Zr)$O_3$ polycrystal) has been dominant in the most of the piezoelectric applications. These materials have the best piezoelectric properties: additive-free PZT has a maximum piezoelectric coefficient $d_{33}$ of about 220 pC/N and soft PZT improved by addition has a maximum piezoelectric coefficient $d_{33}$ of about 400 to 580 cp/N. Therefore they have been synonymous with piezoelectric materials in the past half century. However, since PZT contains a large amount of toxic lead, strict regulations have now been imposed on them from environmental reasons. Accordingly, developing a high performance lead-free piezoelectric material comparable to PZT is an urgent problem in the world.

Under such circumstances, there have been recently numerous studies on lead-free piezoelectric materials, but their piezoelectric and electrostrain properties are far inferior to those of PZT (most of the materials have a $d_{33}$ of 200 pC/N or less). Although recently developed lead-free piezoelectric materials KNN-LT ((K,Na)Nb$O_3$—LiTa$O_3$)) and KNN-LN ((K,Na)Nb$O_3$—LiNb$O_3$) have a relatively good piezoelectric coefficient $d_{33}$ of about 150-300 pC/N, the values are still less than that of soft PZT.

Moreover, KNN-LT and KNN-LN based materials have serious flaws of the difficulty in synthesis and high cost due to a large amount of expensive elements of Ta, La in the materials.

Non-Patent Document 1: Zhi Yu, Ruyan Guo, and A. S. Bhalla, Dielectric behavior of Ba(Ti$_{1-x}$Zr$_x$)$O_3$ single crystals. J. Appl. Phys. 88, 410 (2000)

Non-Patent Document 2: T. Mitsui and W. B. Westphal, Dielectric and X-Ray Studies of Ca$_x$Ba$_{1-x}$Ti$O_3$ and Ca$_x$Sr$_{1-x}$Ti$O_3$. Phys. Rev. 124, 1354-1359 (1961)

DISCLOSURE OF THE INVENTION

Problems to be Solved by the Invention

To solve the above important problems, an object of the present invention is to provide a lead-free piezoelectric material capable of showing a high piezoelectric coefficient ($d_{33}$>500 pC/N) exceeding that of soft PZT.

Means for Solving the Problems

Invention 1 is a lead-free piezoelectric material containing no toxic element such as Pb, comprising a pseudo-binary solid solution of $\{[(Ba_{1-x1}M1_{x1})((Ti_{1-x}Zr_x)_{1-y1}N1_{y1})O_3]\text{-}\delta\%$ $(Ba_{1-y}Ca_y)_{1-x2}M2_{x2})(Ti_{1-y2}N2_{y2})O_3]\}$ (wherein M1, N1, M2 and N2 represent an additive element)(abbreviated as BZT-$\delta$% BCT).

Invention 2 is the lead-free piezoelectric material according to Invention 1, wherein the pseudo-binary solid solution has a morphotrophic phase boundary (MPB).

ADVANTAGES OF THE INVENTION

The present inventors have found that BZT-$\delta$% BCT has a morphotrophic phase boundary (MPB) (FIG. 1 illustrating an example of [Ba(Ti$_{0.8}$Zr$_{0.2}$)$O_3$]-$\delta$ %[(Ba$_{0.7}$Ca$_{0.3}$)Ti$O_3$]), and a piezoelectric material has extremely high piezoelectric properties ($d_{33}$>580 pC/N) exceeding that of PZT at a composition near the MPB (FIGS. 2 and 3). In the present invention, a material using a pseudo-binary solid solution which has a MPB is invented based on the above findings.

This material has an extremely high piezoelectric effect with a piezoelectric coefficient $d_{33}$>580 pC/N at room temperature at a MPB composition ($\delta$%=50%) (FIG. 2), which is several times higher than that of conventional lead-free piezoelectric materials (FIG. 3). Even compared with that of PZT family, the piezoelectric coefficient of the inventive material is higher than that of conventional soft PZT ($d_{33}$>400 pC/N) and is comparable to that of PZT-5H, the number-one soft PZT (FIG. 3). The evaluation of the piezoelectric effect based on the electric field-electrostrain relationship shows that piezoelectric properties at the MPB composition ($\delta$%=50%) are greater than those of PZT-5H (FIG. 4).

High piezoelectric properties ($d_{33}$>350 pC/N) have been observed at most MPB compositions in a temperature range of room temperature to 70° C. (FIG. 5), suggesting that the material can be satisfactorily used for applications at about room temperature. Furthermore, the properties of the material may be improved by an additive element.

Since these materials are composed of extremely stable oxide, they have no problem of volatility as in KNN materials or (Bi$_{0.5}$Na$_{0.5}$)Ti$O_3$. They have excellent sintering properties and thus can be produced very easily. Also, since no expensive raw material such as Nb or Ta is used, raw material and manufacturing costs are low. Moreover, there is no problem of deliquescence or sensitivity to moisture like KNN materials.

With the above characteristics, the material proposed in the present invention is a potential alternative to PZT in the applications at about room temperature or lower.

BEST MODE FOR CARRYING OUT THE INVENTION

To form a MPB, a solid solution composed of two terminals having a different structure is necessary. Two terminal compositions used in the present invention include $Ba(Ti_{1-x}Zr_x)O_3$ having a rhombohedral (R) structure and $(Ba_{1-y}Ca_y)TiO_3$ having a tetragonal (T) structure. To stabilize the R structure of $Ba(Ti_{1-x}Zr_x)O_3$, it is necessary that x>0.1 (Document 1). However, when x>0.5, ferroelectricity is remarkably decreased. Therefore, it is appropriate that x=0.1 to 0.5. To stabilize the T structure of $(Ba_{1-y}Ca_y)TiO_3$ up to −50° C., it is necessary that y>0.1 (Document 2). However, when y>0.7, ferroelectricity is remarkably decreased. Therefore, it is appropriate that y=0.1 to 0.7. From the above reasons, it is appropriate that x in claim 1 is 0.1 to 0.5 and y in claim 1 is 0.1 to 0.7. Further, since addition of an additive element M1, N1, M2 or N2 described in the following paragraphs [0012] to [0015] to the above material does not affect the existence of the MPB, the present invention also includes the above materials containing such an additive element.

Figure 1:
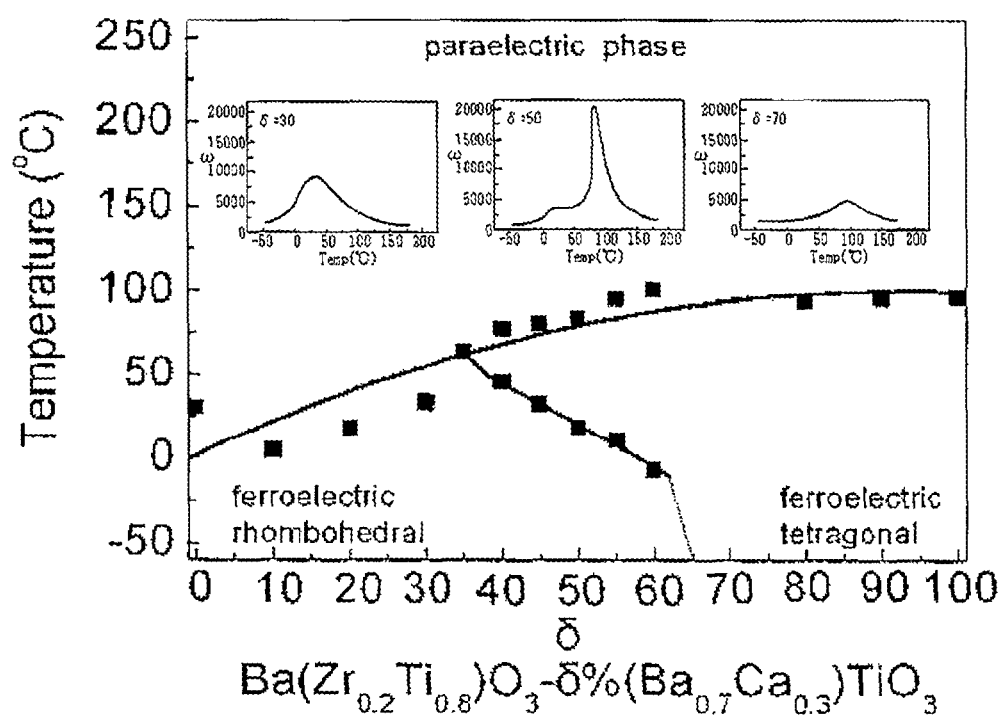
FIG. 1 is a phase diagram of a pseudo-binary system [Ba(Ti$_{0.8}$Zr$_{0.2}$)$O_3$]-$\delta$%[(Ba$_{0.7}$Ca$_{0.3}$)Ti$O_3$]. The MPB exists in the composition range of $\delta$%=40 to 60%. The relationship between the dielectric constant and temperature is shown in the insets.

FIG. 1 shows a phase diagram of a pseudo-binary solid solution $[Ba(Ti_{0.8}Zr_{0.2})O_3]$-$\delta\%[(Ba_{0.7}Ca_{0.3})TiO_3]$ as an example of a phase diagram of a pseudo-binary solid solution composed of the above two terminal compositions. The MPB of the R/T phase clearly exists in the composition range of $\delta\%=40$ to 60% BCT.

Figure 2:
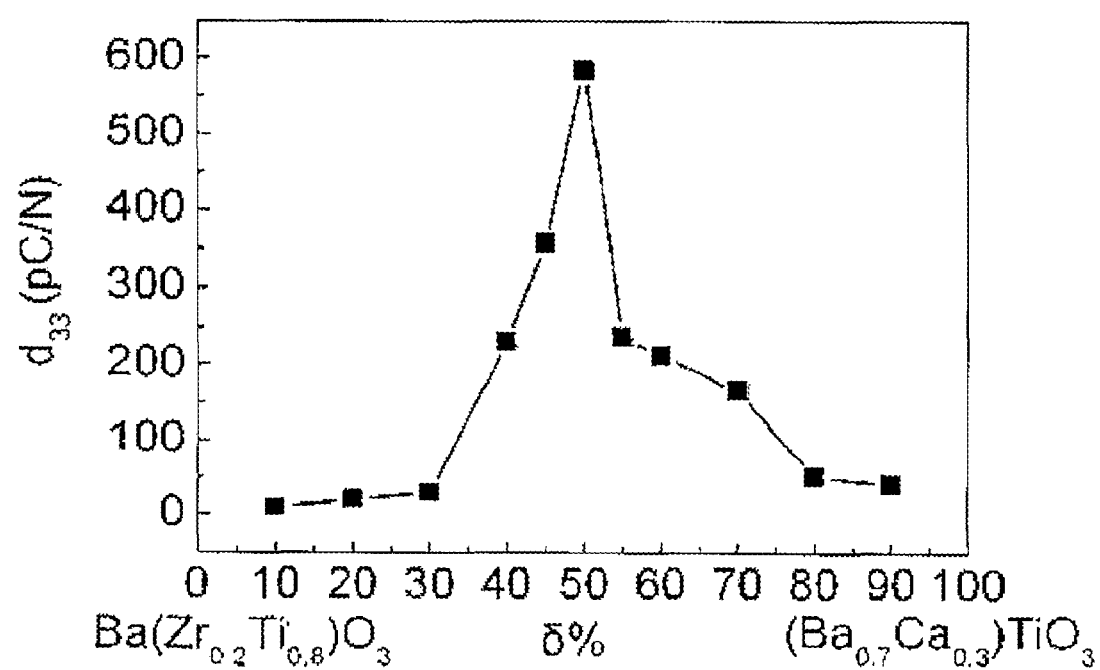
FIG. 2 is a graph showing the composition ($\delta$%) dependency of piezoelectric property $d_{33}$ of [Ba(Ti$_{0.8}$Zr$_{0.2}$)$O_3$]-$\delta$% [(Ba$_{0.7}$Ca$_{0.3}$)Ti$O_3$] at room temperature. The highest piezoelectric coefficient $d_{33}$ value is found at the MPB composition.
Figure 3:
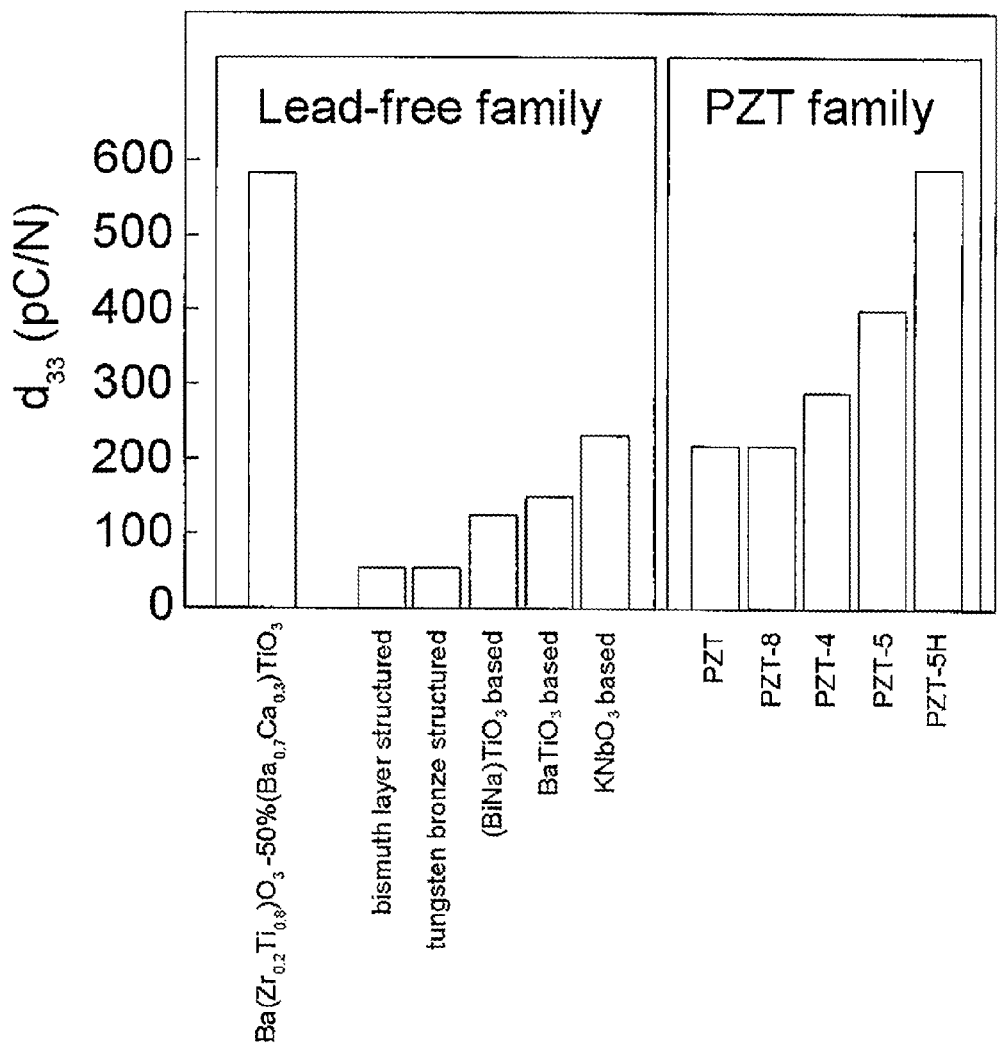
FIG. 3 illustrates a comparison between piezoelectric properties $d_{33}$ of a piezoelectric material at a MPB composition of $\delta$%=50% BCT and those of other piezoelectric materials.

FIGS. 2 and 3 show that the material has the best properties ($d_{33}$=584 pC/N) at $\delta\%=50\%$.

Figure 4:
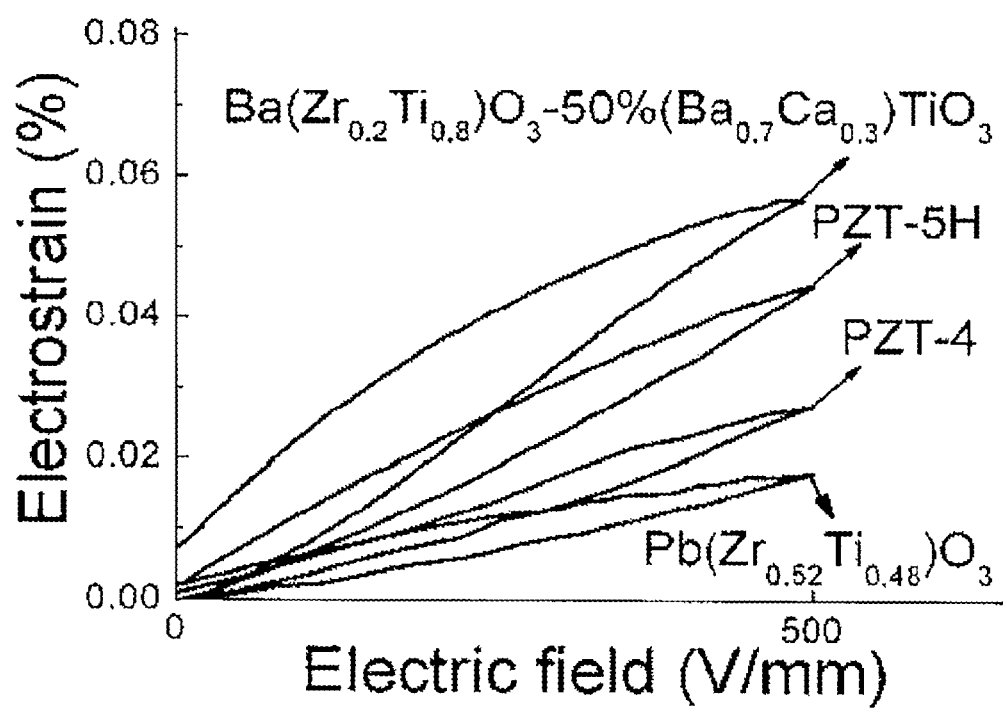
FIG. 4 is a graph showing a relationship between electrostrain and electric field of a polarized $\delta$%=50% sample at room temperature. The figure shows that properties of the $\delta$%=50% sample exceed those of soft PZT.

FIG. 4 shows a relationship between electrostrain and electric field of a polarized $\delta\%=50\%$ sample at room temperature. The figure shows that the material has piezoelectric properties exceeding that of all PZT materials including PZT-5H, the number-one soft PZT.

Figure 5:
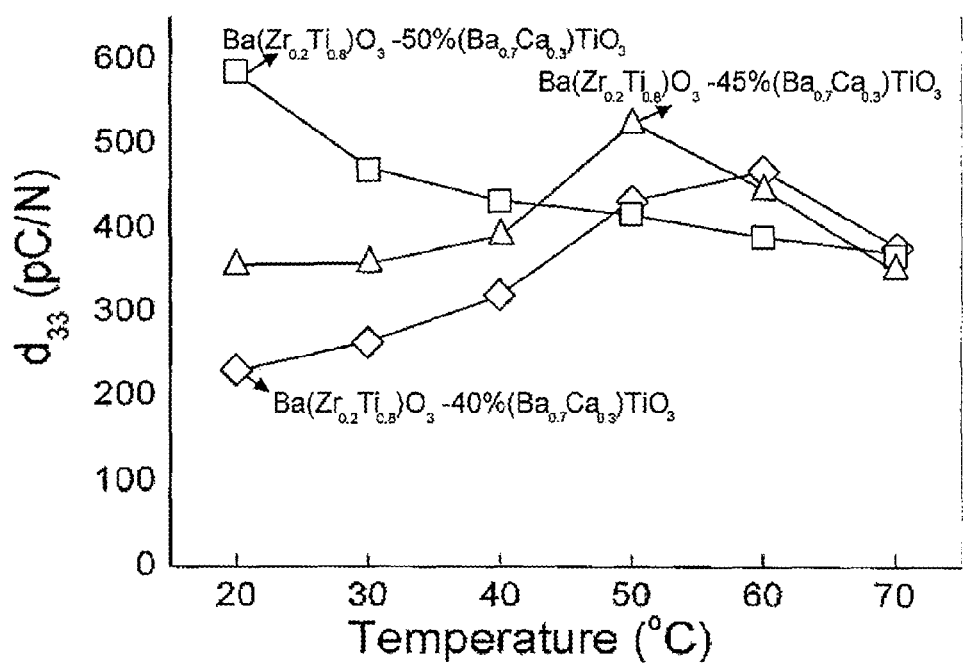
FIG. 5 is a graph showing the temperature dependency of piezoelectric coefficient $d_{33}$ of $\delta\%=40\%$, 45% and 50% samples.

FIG. 5 is a graph showing the temperature dependency of piezoelectric coefficient $d_{33}$ of $\delta\%=40\%$, 45% and 50% samples. The figure shows that these three compositions near the MPB maintain a high piezoelectric coefficient up to 70° C. (for the $\delta\%=45\%$, 50% samples, $d_{33}$>350 pC/N in this temperature range). Therefore, the lead-free piezoelectric material of the present invention is suitable for the application at about room temperature.

Even if materials are represented by a different chemical formula, naturally their effective chemical composition is equivalent to that of the materials of Inventions 1 and 2. For example, materials represented by the formula (BaCa)(TiZr)$O_3$ or $BaTiO_3$—$BaZrO_3$—$CaTiO_3$ are also included in the present invention.

The present invention also includes pseudo-binary lead-free piezoelectric materials shown in the following Examples, in which some of the elements are substituted with an element of the same valence as constituent ions.

Therefore, in the present invention, the materials are represented by $\{[(Ba_{1-x1}M1_{x1})(Ti_{1-x}Zr_x)_{1-y1}N1_{y1})O_3]$-$\delta\%[(Ba_{1-y}Ca_y)_{1-x2}M2_{x2})(Ti_{1-y2}N2_{y2})O_3]\}$ (wherein M1, N1, M2 and N2 represent an additive element). Since BZT-BCT has an $A^{2+}B^{4+}O_3$ perovskite structure, $Ba^{2+}$ and $Ca^{2+}$ occupy the $A^{2+}$ site, and $Ti^{4+}$ and $Zr^{4+}$ occupy the $B^{4+}$ site. The "element of the same valence as constituent ions" means an element having a valence of 2+ (e.g., $Sr^{2+}$) when substituting in the $A^{2+}$ site, and an element having a valence of 4+ (e.g., $Hf^{4+}$, $Sn^{4+}$) when substituting in the $B^{4+}$ site. Further an "additive element of the same valence" may be prepared by combining elements having a different valence (for example, elements may be substituted with $\frac{1}{2}Bi^{3+}+\frac{1}{2}Na^+$ (average valence being 2+) in the $A^{2+}$ site).

Also, some of the elements may be substituted with an "acceptor additive element".

Acceptor Additive Element

Additive elements (M1, M2) having a valence of +2 or lower substituting in the $A^{2+}$ site: $K^+$, $Na^+$, $Li^+$, $Ag^+$ and others Additive elements (N1, N2) having a valence of +4 or lower substituting in the $B^{4+}$ site: $Mn^{3+}$, $Fe^{3+}$, $Co^{3+}$, $Ni^{2+}$, $Cu^{2+}$ and others.

The "addition of an acceptor additive element" is a common improvement method for reducing the loss of piezoelectric materials. A material prepared by using BZT-BCT and improved by the "addition of an acceptor additive element" is also included in the scope of the present invention.

Also, some of the elements may be substituted with a "donor additive element".

Donor Additive Element

Additive elements having a valence of +2 or higher substituting in the $A^{2+}$ site: $La^{3+}$, $Bi^{3+}$, $Y^{3+}$, $Ce^{3+}$, $Rh^{3+}$ and others Additive elements having a valence of +4 or higher substituting in the $B^{4+}$ site: $Nb^{5+}$, $Ta^{5+}$ and others The "addition of a donor additive element" is a common improvement method for increasing piezoelectric properties of piezoelectric materials. A material prepared by using BZT-BCT and improved by the "addition of a donor additive element" is also included in the scope of the present invention.

Some of the elements may be simultaneously substituted with both of an "acceptor additive element" and a "donor additive element".

Even if the above materials are formed into a conventionally known form of polycrystal, single crystal, thin film or multilayered film, they are also included in the scope of the present invention. Further, using the materials for composite materials, parts, equipment or devices is within the scope that can be easily conceived based on the conventionally known techniques.

EXAMPLES

FIG. 1 is a phase diagram of a pseudo-binary solid solution $[Ba(Ti_{0.8}Zr_{0.2})O_3]$-$\delta\%[(Ba_{0.7}Ca_{0.3})TiO_3]$. The relationship between the dielectric constant and temperature is shown in the insets. It is shown that the MPB exists in the composition range of $\delta\%=40$ to 60%.

Process for Preparing Samples

Raw materials: $BaZrO_3$ (99.9%), $CaCO_3$ (99.9%), $BaCO_3$ (99.9%) and $TiO_2$ (99.9%)

Process of preparation: Standardized solid phase sintering process. Synthesized at 1350° C. for 2 hours and sintered at 1450° C. for 3 hours. (The temperature needs to be 1200° C. to 1400° C. for the synthesis and 1300° C. to 1500° C. for sintering.)

Electrode: Ag electrode

Polarization conditions: An electric field of about twice the coercive field is applied to a sample at the Curie temperature (110° C.) or higher and the sample is gradually cooled to room temperature.

Shape and size of samples: The samples are a disk having a thickness of 6.5 mm and a diameter of 8 mm.

Method of measuring piezoelectric properties: The piezoelectric coefficient $d_{33}$ is measured by a Model ZJ-6B $d_{33}$ meter. The electric field-displacement was measured by Workstation and MTI2000 Photonic Sensor made by Radiant Technologies Inc.

FIG. 2 is based on the measured values (Table 1) of the relationship between the piezoelectric coefficient $d_{33}$ and the composition δ% at room temperature. FIG. 2 shows that the material has a high piezoelectric coefficient near the MPB. The figure shows that the material has the best properties ($d_{33}$=583 pC/N) particularly at δ%=50%. The present invention provides a lead-free piezoelectric material using the MPB.

TABLE 1

$Ba(Zr_{0.2}Ti_{0.8})O_3$-δ%$(Ba_{0.7}Ca_{0.3})TiO_3$

| δ | $d_{33}$ (pC/N) |
|---|---|
| 10 | 10 |
| 20 | 20 |
| 30 | 30 |
| 40 | 230 |
| 45 | 356 |
| 50 | 584 |
| 55 | 236 |
| 60 | 212 |
| 70 | 165 |
| 80 | 52 |
| 90 | 40 |

FIG. 3 is based on the measured values (Table 2) of the comparison between the piezoelectric coefficient $d_{33}$ of a δ%=50% lead-free piezoelectric material, those of other lead-free piezoelectric materials and those of PZT family.

As is evident from the figure, not only the lead-free piezoelectric material of the present invention has piezoelectric properties twice or several times higher than that of other lead-free piezoelectric materials, but also the piezoelectric properties exceed those of most PZT materials. The figure demonstrates the innovativeness of the present invention.

TABLE 2

| Non-lead family | | $d_{33}$ (pC/N) (typical value) |
|---|---|---|
| $Ba(Zr_{0.2}Ti_{0.8})O_3$-50%$(Ba_{0.7}Ca_{0.3})TiO_3$ | | 584 |
| bismuth layer structured | | 50 |
| tungsten bronze structured | | 50 |
| (BiNa)TiO₃ based | | 125 |
| $BaTiO_3$ based | | 148 |
| $KNbO_3$ based | | 230 |
| PZT family | $Pb(Zr_{0.52}Ti_{0.48})O_3$ | 220 |
| | PZT-8 | 220 |
| | PZT-4 | 289 |
| | PZT-5 | 400 |
| | PZT-5H | 590 |

FIG. 4 is based on the measured values (Table 3) of the comparison of the electric field-displacement relationship of a polarized δ%=50% lead-free piezoelectric material of the present invention with that of PZT family.

The electric field-displacement relationship describes piezoelectric properties in a high electric field. The figure shows that the lead-free piezoelectric material of the present invention has much better piezoelectric properties than all PZT materials in a high electric field.

TABLE 3

| Material | | Electrostrain (%) in an electric field of 500 V/mm |
|---|---|---|
| $Ba(Zr_{0.2}Ti_{0.8})O_3$-50%$(Ba_{0.7}Ca_{0.3})TiO_3$ | | 0.057 |
| PZT family | $Pb(Zr_{0.52}Ti_{0.48})O_3$ | 0.018 |
| | PZT-4 | 0.028 |
| | PZT-5H | 0.044 |

FIG. 5 is a graph based on the measured values (Table 1) of the temperature dependency of piezoelectric coefficient $d_{33}$ of δ%=40%, 45% and 50% samples.

The figure shows that the three compositions near the MPB maintain a high piezoelectric coefficient up to 70° C. Therefore, the lead-free piezoelectric material of the present invention is suitable for the application at about room temperature.

TABLE 4

| Material | Temperature (° C.) | $d_{33}$ (pc/N) |
|---|---|---|
| $Ba(Zr_{0.2}Ti_{0.8})O_3$-40%$(Ba_{0.7}Ca_{0.3})TiO_3$ | 20 | 230 |
| | 30 | 264 |
| | 40 | 320 |
| | 50 | 431 |
| | 60 | 467 |
| | 70 | 377 |
| $Ba(Zr_{0.2}Ti_{0.8})O_3$-45%$(Ba_{0.7}Ca_{0.3})TiO_3$ | 20 | 356 |
| | 30 | 358 |
| | 40 | 392 |
| | 50 | 524 |
| | 60 | 445 |
| | 70 | 350 |
| $Ba(Zr_{0.2}Ti_{0.8})O_3$-50%$(Ba_{0.7}Ca_{0.3})TiO_3$ | 20 | 584 |
| | 30 | 470 |
| | 40 | 432 |
| | 50 | 415 |
| | 60 | 390 |
| | 70 | 368 |

Industrial Applicability

The piezoelectric material of the present invention can be used in almost all of the applications of conventional PZT and other piezoelectric materials at about room temperature (up to 70° C.). Some examples are shown below.

Electronic sound sources for home electric appliances and clocks

Underwater exploration sources for fishfinders and sonars

Ignition sources for gas lighters

Exploration sources for solid such as metal, concrete and earth crust

Atomization sources for humidifiers and inhalers

Ultrasonic sources for various cleaners

Back sonars and corner sensors for automobiles

Pumps for inkjet printers

Inverter transformers for liquid crystal monitors

Microactuators for scanning electron microscopes

Ultrasonic sources for medical diagnostic devices and massaging tools

Clock signal sources for phones and remote controllers

Counters for pedometers

Touch sensors for PC monitors

The invention claimed is:

1. A lead-free piezoelectric material containing no toxic element comprising:

a pseudo-binary solid solution of $\{[(Ba_{1-x1}M1_{x1})((Ti_{1-x}Zr_x)_{1-y1}N1_{y1})O_3]$-δ%$[(Ba_{1-y}Ca_y)_{1-x2}M2_{x2})(Ti_{1-y2}N2_{y2})O_3]\}$ (wherein x=0.1 to 0.5; y=0.1 to 0.7; δ%=10 to 90%; $0 \leq x1, x2, y1, y2 \leq 1$; each of M1, N1, M2 and N2 represents an additive element wherein each of M1 and M2 is selected from the group consisting of $K^+$, $Na^+$, $Li^+$ and $Ag^+$, and each of N1 and N2 is selected from the group consisting of $Mn^{3+}$, $Fe^{3+}$, $Co^{3+}$, $Ni^{2+}$ and $Cu^{2+}$; each of x1, y1, x2 and y2 represents a concentration of M1, N1, M2, N2, respectively)(abbreviated as BZT-δ% BCT), wherein the pseudo-binary solid solution has a morphotrophic phase boundary (MPB).

2. The lead-free piezoelectric material according to claim 1, wherein the pseudo-binary solid solution is $Ba(Zr_{0.2}Ti_{0.8})O_3$-$\delta$%$[Ba_{0.7}Ca_{0.3})TiO_3]$.

3. The lead-free piezoelectric material according to claim 1, wherein $\delta$%=40 to 60%.

* * * * *